(12) United States Patent
Chen

(10) Patent No.: US 11,515,316 B2
(45) Date of Patent: Nov. 29, 2022

(54) SEMICONDUCTOR MEMORY DEVICE

(71) Applicant: UNITED MICROELECTRONICS CORP., Hsin-Chu (TW)

(72) Inventor: Tzu-Ping Chen, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 112 days.

(21) Appl. No.: 17/103,872

(22) Filed: Nov. 24, 2020

(65) Prior Publication Data

US 2022/0139938 A1    May 5, 2022

(30) Foreign Application Priority Data

Nov. 5, 2020   (CN) .......................... 202011221820.5

(51) Int. Cl.
*H01L 27/11524* (2017.01)
*H01L 27/11558* (2017.01)
*H01L 27/11519* (2017.01)

(52) U.S. Cl.
CPC .. *H01L 27/11524* (2013.01); *H01L 27/11519* (2013.01); *H01L 27/11558* (2013.01)

(58) Field of Classification Search
CPC ......... H01L 27/11524; H01L 27/11519; H01L 27/11558
See application file for complete search history.

(56) References Cited

U.S. PATENT DOCUMENTS 9,490,016 B2      11/2016  Chen
10,332,964 B2 *   6/2019   Lee ..................... H01L 29/7883

* cited by examiner

*Primary Examiner* — Allison Bernstein
(74) *Attorney, Agent, or Firm* — Winston Hsu

(57) ABSTRACT

A semiconductor memory device includes a select transistor and a floating gate transistor on a substrate. The select transistor includes a select gate, a select gate oxide layer and a drain doping region. The floating gate transistor includes a floating gate, a floating gate oxide layer, a source doping region, a first tunnel doping region and a second tunnel doping region under the floating gate, a first tunnel oxide layer on the first tunnel doping region, and a second tunnel oxide layer on the second tunnel doping region. The floating gate oxide layer is disposed between the first tunnel oxide layer and the second tunnel oxide layer. A lightly doped diffusion region surrounds the source doping region and the second tunnel doping region.

18 Claims, 3 Drawing Sheets

|  | $V_D$ | $V_{SG}$ | $V_{CG}$ | $V_S$ |
|---|---|---|---|---|
| Program | 0V | 7V | 9.5V | 5V |
| Program inhibit | 5V | 7V | 9.5V | 5V |
| Erase | 2V | 0V | 0V | 9.5V |

FIG. 4

SEMICONDUCTOR MEMORY DEVICE

BACKGROUND OF THE INVENTION

1. Field of the Invention

The present invention relates to a semiconductor memory device, in particular to a flash memory device with two tunnel oxide layers arranged between a floating gate and a substrate.

2. Description of the Prior Art

Flash memory is a type of non-volatile memory that can retain the information stored in the memory when it lacks an external power supply. In recent years, flash memory has been widely used in mobile phones, digital cameras, video players, personal digital assistants (PDA) and other electronic products, or systems on a chip (SOC) under development due to its advantages such as rewritable and electronically erased.

However, in today's flash memory architecture, only a single-sided tunnel oxide layer is usually used for writing or erasing operations. This operation not only affects the operating speed of the entire memory, but also easily reduces the endurance and life span of the memory. Therefore, how to improve the existing structure and operation method to increase the overall durability of the flash memory is an important issue.

SUMMARY OF THE INVENTION

One object of the present invention is to provide an improved non-volatile semiconductor memory device to solve the deficiencies and shortcomings of the prior art.

According to one aspect of the invention, a semiconductor memory device includes a substrate having a first conductivity type. The substrate comprises a first active area surrounded by a trench isolation region. A select transistor is disposed on the first active area. The select transistor comprises a select gate, a select gate oxide layer under the select gate, and a drain doping region having a second conductivity type disposed adjacent to the select gate. A floating gate transistor is disposed on the first active area and in proximity to the select transistor. The floating gate transistor comprises a floating gate, a floating gate oxide layer under the floating gate, a source doping region having the second conductivity type disposed adjacent to the floating gate, a first tunnel doping region under the floating gate and between the floating gate oxide layer and the source doping region, a first tunnel oxide layer on the first tunnel doping region, a second tunnel doping region under the floating gate and between the floating gate dielectric layer and the select gate, and a second tunnel oxide layer on the second tunnel doping region. A lightly doped diffusion region having the second conductivity type surrounds the source doping region and the second tunnel doping region.

According to some embodiments, the first conductivity type is P type and the second conductivity type is N type.

According to some embodiments, the first tunnel doping region and the second tunnel doping region are N$^+$ doping regions.

According to some embodiments, the lightly doped diffusion region is an N$^-$ doping region.

According to some embodiments, the first tunnel doping region is contiguous with the source doping region.

According to some embodiments, the select gate oxide layer has a thickness smaller than that of the floating gate oxide layer.

According to some embodiments, the floating gate oxide layer has a thickness ranging between 200 angstroms and 380 angstroms.

According to some embodiments, the select gate oxide layer has a thickness ranging between 50 angstroms and 130 angstroms.

According to some embodiments, the first tunnel oxide layer is disposed directly on the first tunnel doping region, and wherein the first tunnel oxide layer has a thickness smaller than that of the floating gate oxide layer.

According to some embodiments, the second tunnel oxide layer is disposed directly on the second tunnel doping region, and wherein the second tunnel oxide layer has a thickness smaller than that of the floating gate oxide layer.

According to some embodiments, first tunnel oxide layer and the second tunnel oxide layer have a thickness ranging between 70 angstroms and 95 angstroms.

According to some embodiments, the semiconductor memory device further includes a first peripheral gate oxide layer that is contiguous with the first tunnel oxide layer. The first peripheral gate oxide layer has a thickness that is greater than that of the first tunnel oxide layer.

According to some embodiments, the floating gate has a first edge that is aligned with an outer edge of the first peripheral gate oxide layer.

According to some embodiments, the semiconductor memory device further includes a second peripheral gate oxide layer that is contiguous with the second tunnel oxide layer. The second peripheral gate oxide layer has a thickness that is greater than that of the second tunnel oxide layer.

According to some embodiments, the floating gate has a second edge that is aligned with an outer edge of the second peripheral gate oxide layer.

According to some embodiments, the semiconductor memory device further includes a second active area in proximity to the first active area. The first active area is isolated from the second active area by the trench isolation region. The floating gate extends to the second active area from the first active area. A control gate doping region having the second conductivity type is disposed within the second active area.

According to some embodiments, the control gate doping region is an N$^+$ doping region.

According to some embodiments, the control gate doping region is capacitively coupled to the floating gate.

According to some embodiments, the lightly doped diffusion region surrounds the control gate doping region.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 illustrates the voltage conditions of the write operation and the erase operation.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
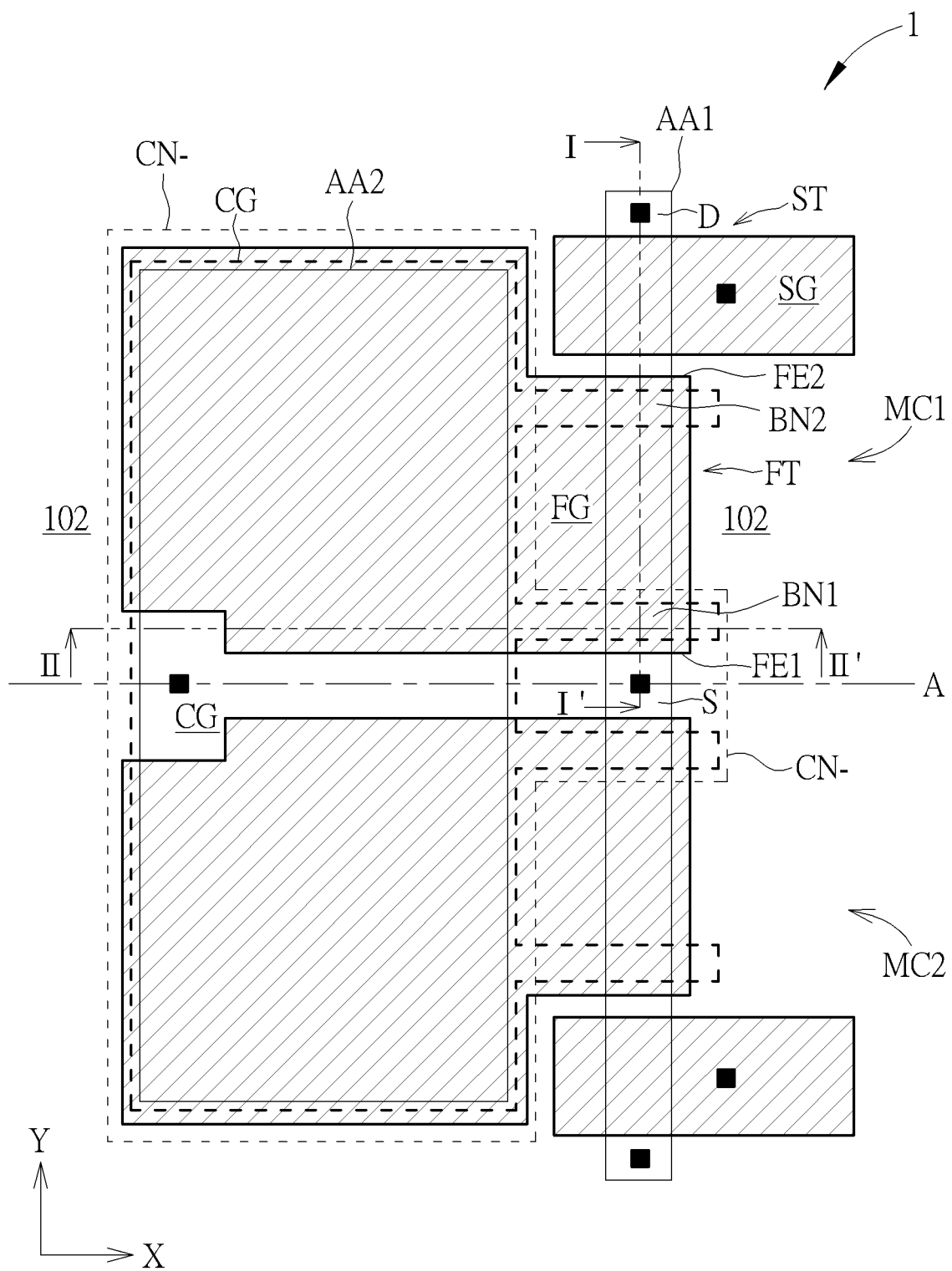
FIG. 1 is a schematic diagram of the layout of a semiconductor memory device according to an embodiment of the present invention.
Figure 2:
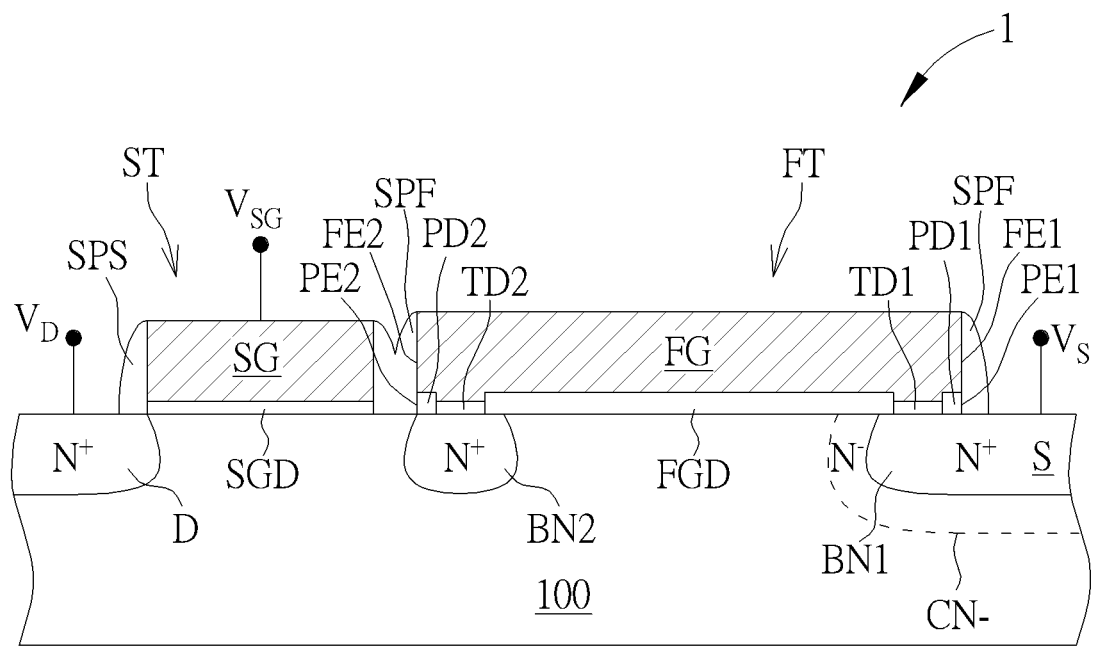
FIG. 2 is a schematic cross-sectional view taken along the line I-I' in FIG. 1.
Figure 3:
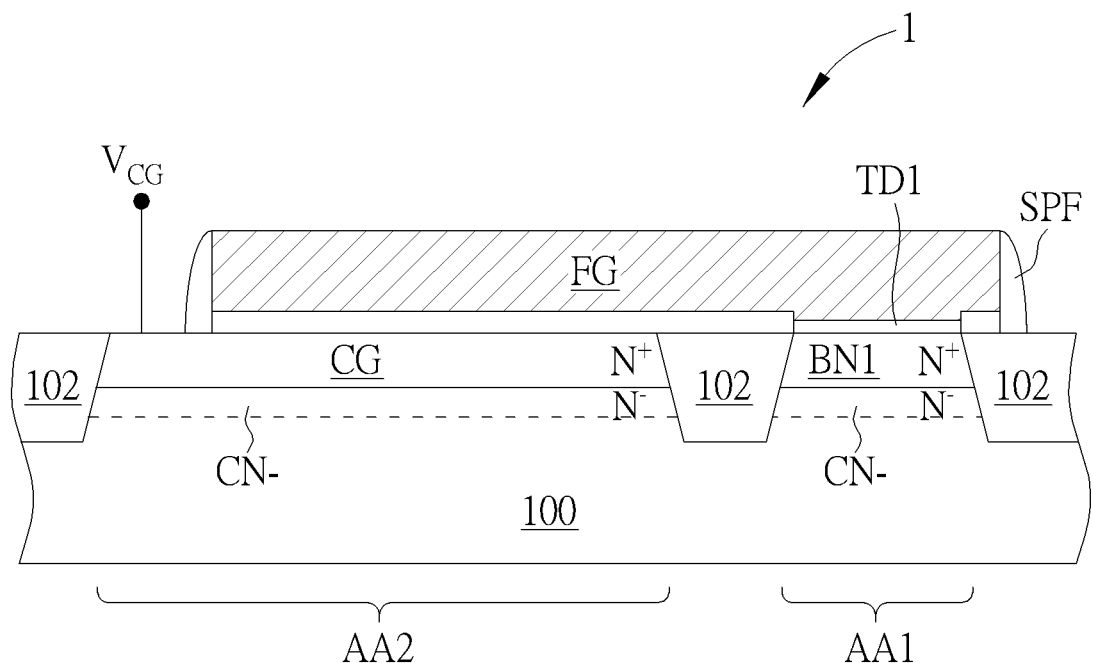
FIG. 3 is a schematic cross-sectional view taken along the line II-I' in FIG. 1.

Please refer to FIGS. 1 to 3. FIG. 1 is a schematic diagram showing a layout of a semiconductor memory device 1 according to an embodiment of the present invention. FIG. 2 is a schematic cross-sectional view taken along line II' in FIG. 1. FIG. 3 is a schematic cross-sectional view taken along line II-II' in FIG. 1. The semiconductor memory device 1 illustrated in FIG. 1 includes two memory cells MC1 and MC2 that are mirror-symmetrical to each other with respect to the symmetry axis A. In the following embodiments, a single-poly nonvolatile memory device is taken as an example for illustration. However, those skilled in the art should understand that the present invention can also be used in other types of semiconductor memory structure, for example, a stack gate type memory (stacking a control gate on a floating gate).

As shown in FIGS. 1 to 3, the semiconductor memory device 1 includes a substrate 100, for example, a silicon substrate, having a first conductivity type, for example, P type. The substrate 100 includes a first active area AA1 surrounded by a trench isolation region 102 region. According to an embodiment of the present invention, the first active area AA1 may be an elongated area extending along the reference Y axis. According to an embodiment of the present invention, the semiconductor memory device 1 includes a selective transistor ST disposed on the first active area AA1. According to an embodiment of the present invention, the select transistor ST includes a select gate SG, a select gate oxide layer SGD under the select gate SG, and a drain doping region D adjacent to the select gate SG According to an embodiment of the present invention, the drain doping region D has a second conductivity type, for example, N type.

According to an embodiment of the present invention, the semiconductor memory device 1 includes a floating gate transistor FT disposed on the first active area AA1 and in proximity to the selection transistor ST. According to an embodiment of the present invention, the floating gate transistor FT includes a floating gate FG, a floating gate oxide layer FGD under the floating gate FG, a source doping region S having a second conductivity type (for example, $N^+$-type) and adjacent to the floating gate FG, a first tunnel doping region BN1 under the floating gate FG and between the floating gate oxide layer FGD and the source doping region S, a first tunnel oxide layer TD1 on the first tunnel doping region BN1, a second tunnel doping region BN2 under the floating gate FG and between the floating gate dielectric layer FGD and the select gate SG, and a second tunnel oxide layer TD2 on the second tunnel doping region BN2.

As shown in FIG. 1, the memory cell MC1 and the memory cell MC2 share the source doping region S. According to an embodiment of the present invention, the first tunnel doping region BN1 is adjacent to and contiguous with the source doping region S. According to an embodiment of the present invention, for example, the first tunnel doping region BN1 and the second tunnel doping region BN2 are $N^+$ doped regions.

According to an embodiment of the present invention, the thickness of the select gate oxide layer SGD is smaller than the thickness of the floating gate oxide layer FGD. According to an embodiment of the present invention, for example, the thickness of the gate oxide layer SGD is selected to be between 50 angstroms and 130 angstroms. According to an embodiment of the present invention, for example, the thickness of the floating gate oxide layer FGD is between 200 angstroms and 380 angstroms.

According to an embodiment of the present invention, the first tunnel oxide layer TD1 is disposed directly on the first tunnel doping region BN1. According to an embodiment of the present invention, the thickness of the first tunnel oxide layer TD1 is smaller than the thickness of the floating gate oxide layer FGD. According to an embodiment of the present invention, the second tunnel oxide layer TD2 is disposed directly on the second tunnel doping region BN2. According to an embodiment of the present invention, the thickness of the second tunnel oxide layer TD2 is smaller than the thickness of the floating gate oxide layer FGD. According to an embodiment of the present invention, for example, the thickness of the first tunnel oxide layer TD1 and the second tunnel oxide layer TD2 is between 70 angstroms and 95 angstroms.

As shown in FIG. 2, the semiconductor memory device 1 includes a first peripheral gate oxide layer PD1 adjacent to the first tunnel oxide layer TD1. The thickness of the first peripheral gate oxide layer PD1 is greater than the thickness of the first tunnel oxide layer TD1. According to an embodiment of the present invention, the floating gate FG has a first edge FE1 aligned with an outer edge PE1 of the first peripheral gate oxide layer PD1. The semiconductor memory device 1 includes a second peripheral gate oxide layer PD2 adjacent to the second tunnel oxide layer TD2. The thickness of the second peripheral gate oxide layer PD2 is greater than the thickness of the second tunnel oxide layer TD2. According to an embodiment of the present invention, the floating gate FG has a second edge FE2 aligned with an outer edge PE2 of the second peripheral gate oxide layer PD2. According to an embodiment of the present invention, a spacer SPF may be provided on a sidewall of the floating gate FG, for example, a silicon nitride spacer, but not limited thereto.

As shown in FIGS. 1 to 3, the semiconductor memory device 1 further includes a lightly doped diffusion region (cell N− implant) CN− with a second conductivity type (for example, N-type), surrounding the source doping region S and the first tunnel doping region BN1. According to an embodiment of the present invention, for example, the lightly doped diffusion region CN− may be an $N^-$ doping region.

As shown in FIGS. 1 and 3, the semiconductor memory device 1 further includes a second active area AA2, which is in proximity to the first active area AA1. According to an embodiment of the present invention, for example, the second active area AA2 may be a rectangular area with its width in the reference X-axis direction larger than that of the first active area, but is not limited thereto. According to an embodiment of the present invention, the first active area AA1 is isolated from the second active area AA2 by the trench isolation area 102. According to an embodiment of the present invention, the floating gate FG extends from the first active area AA1 to the second active area AA2. The floating gate FG is capacitively coupled with a control gate doping region CG that is disposed in the second active area AA2 and has a second conductivity type (for example, N-type). According to an embodiment of the present invention, the control gate doping region CG may be an N+ doped region. According to an embodiment of the present invention, the lightly doped diffusion region CN− surrounds the control gate doping region CG.

Please refer to FIG. 4, which illustrates the voltage conditions of the write operation and the erase operation. Please also refer to FIGS. 1 to 3, for example, when operating the memory cell MC1, a source voltage $V_S$ is provided to the source doping region S, a drain voltage $V_D$ is provided to the drain doping region D, and a control gate voltage $V_{CG}$ is provided to the control gate doping region CG, and a select gate voltage $V_{SG}$ is provided to the select gate SG The method of operating the memory cell MC1 mainly utilizes the first tunnel doping region BN1 and the second tunnel doping region BN2 in the structure to improve the endurance of the entire device during operations such as writing and erasing. In turn, the performance and lifespan of the devices are improved.

For example, when a program operation is performed on a selected memory cell, such as the memory cell MC1, as shown in FIG. 4, a voltage of 5 volts ($V_S$=5V) is applied to the source doping region S, and a voltage of 0 volts ($V_D$=0V) is applied to the drain doping region D, a voltage of, for example, 7 volts ($V_{SG}$=7V) is applied to the select gate SG, and a voltage of 9.5 volts is applied to the control gate doping region CG to allow electrons to pass through the tunnel oxide layer TD2 and the electrons can be stored in the floating gate FG to complete the writing operation. For unselected memory cells, a program inhibit operation can be performed, for example, a voltage of 5 volts ($V_S$=5V) is applied to the source doping region S and a voltage of 5 volts ($V_D$=5V) is applied to the drain doping region D, for example, a voltage of 7 volts ($V_{SG}$=7V) is applied to the select gate SG, and a voltage of 9.5 volts is applied to the control gat doping region CG to avoid program disturb.

In the erase operation, as shown in FIG. 4, a voltage of 9.5 volts ($V_S$=9.5V) is applied to the source doping region S, and a voltage of 2 volts is applied to the drain doping region D ($V_D$=0V).), a voltage of 0 volt ($V_{SG}$=0V) is applied to the select gate SG, and a voltage of 0 volt is applied to the control gate doping region CG, so that electrons pass through the first tunnel oxide layer TD1 and move out of the floating gate FG to complete the erase operation. The present invention features left and right tunnel oxide layers TD1 and TD2 between the floating gate FG and the substrate 100, and uses these two tunnel oxide layers TD1 and TD2 for writing and erasing operations. This not only improves the operating speed of the entire memory, but also prolongs the endurance and lifespan of the memory.

During the write operation of the memory cell of the present invention, the select gate SG operates at a relatively low voltage (for example, 7V), so it is not necessary to use high-voltage components (for example, components with an operating voltage higher than 10V) to make the select transistor ST. Therefore, the present invention is more suitable for embedded applications. The operating voltages of the present invention are relatively low, so it is relatively power-saving. Due to the arrangement of the lightly doped diffusion region CN− and the two tunnel oxide layers TD1 and TD2 arranged directly under the floating gate FG, the reliability and durability can be improved. In addition, the memory cell size of the present invention is smaller. It requires less number of masks to form the memory cell, and therefore the production cost is reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate having a first conductivity type, wherein the substrate comprises a first active area surrounded by a trench isolation region;
   a select transistor disposed on the first active area, wherein the select transistor comprises a select gate, a select gate oxide layer under the select gate, and a drain doping region having a second conductivity type disposed adjacent to the select gate;
   a floating gate transistor disposed on the first active area and in proximity to the select transistor, wherein the floating gate transistor comprises a floating gate, a floating gate oxide layer under the floating gate, a source doping region having the second conductivity type disposed adjacent to the floating gate, a first tunnel doping region under the floating gate and between the floating gate oxide layer and the source doping region, a first tunnel oxide layer on the first tunnel doping region, a second tunnel doping region under the floating gate and between the floating gate oxide layer and the select gate, and a second tunnel oxide layer on the second tunnel doping region, wherein the first tunnel doping region is contiguous with the source doping region; and
   a lightly doped diffusion region having the second conductivity type surrounding the source doping region and the first tunnel doping region.

2. The semiconductor memory device according to claim 1, wherein the first conductivity type is P type and the second conductivity type is N type.

3. The semiconductor memory device according to claim 2, wherein the first tunnel doping region and the second tunnel doping region are N+ doping regions.

4. The semiconductor memory device according to claim 1, wherein the lightly doped diffusion region is an N− doping region.

5. The semiconductor memory device according to claim 1, wherein the select gate oxide layer has a thickness smaller than that of the floating gate oxide layer.

6. The semiconductor memory device according to claim 5, wherein the floating gate oxide layer has a thickness ranging between 200 angstroms and 380 angstroms.

7. The semiconductor memory device according to claim 6, wherein the select gate oxide layer has a thickness ranging between 50 angstroms and 130 angstroms.

8. The semiconductor memory device according to claim 1, wherein the first tunnel oxide layer is disposed directly on the first tunnel doping region, and wherein the first tunnel oxide layer has a thickness smaller than that of the floating gate oxide layer.

9. The semiconductor memory device according to claim 8, wherein the second tunnel oxide layer is disposed directly on the second tunnel doping region, and wherein the second tunnel oxide layer has a thickness smaller than that of the floating gate oxide layer.

10. The semiconductor memory device according to claim 9, wherein first tunnel oxide layer and the second tunnel oxide layer have a thickness ranging between 70 angstroms and 95 angstroms.

11. The semiconductor memory device according to claim 1 further comprising:
a first peripheral gate oxide layer that is contiguous with the first tunnel oxide layer, wherein the first peripheral gate oxide layer has a thickness that is greater than that of the first tunnel oxide layer.

12. The semiconductor memory device according to claim 11, wherein the floating gate has a first edge that is aligned with an outer edge of the first peripheral gate oxide layer.

13. The semiconductor memory device according to claim 12 further comprising:
a second peripheral gate oxide layer that is contiguous with the second tunnel oxide layer, wherein the second peripheral gate oxide layer has a thickness that is greater than that of the second tunnel oxide layer.

14. The semiconductor memory device according to claim 13, wherein the floating gate has a second edge that is aligned with an outer edge of the second peripheral gate oxide layer.

15. The semiconductor memory device according to claim 1 further comprising:
a second active area in proximity to the first active area, wherein the first active area is isolated from the second active area by the trench isolation region, wherein the floating gate extends to the second active area from the first active area; and
a control gate doping region having the second conductivity type within the second active area.

16. The semiconductor memory device according to claim 15, wherein the control gate doping region is an $N^+$ doping region.

17. The semiconductor memory device according to claim 15, wherein the control gate doping region is capacitively coupled to the floating gate.

18. The semiconductor memory device according to claim 15, wherein the lightly doped diffusion region surrounds the control gate doping region.

* * * * *